(12) United States Patent
Tsai et al.

(10) Patent No.: US 9,748,363 B2
(45) Date of Patent: Aug. 29, 2017

(54) SEMICONDUCTOR DEVICE INCLUDING FIN STRUCTURES AND MANUFACTURING METHOD THEREOF

(71) Applicant: TAIWAN SEMICONDUCTOR MANUFACTURING CO., LTD., Hsinchu (TW)

(72) Inventors: Chun Hsiung Tsai, Hsinchu County (TW); Tsan-Chun Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/608,147

(22) Filed: Jan. 28, 2015

(65) Prior Publication Data

US 2016/0218199 A1    Jul. 28, 2016

(51) Int. Cl.
| | |
|---|---|
| *H01L 21/336* | (2006.01) |
| *H01L 29/76* | (2006.01) |
| *H01L 29/66* | (2006.01) |
| *H01L 21/225* | (2006.01) |
| *H01L 29/10* | (2006.01) |
| *H01L 29/16* | (2006.01) |

(Continued)

(52) U.S. Cl.
CPC .... *H01L 29/66803* (2013.01); *H01L 21/2256* (2013.01); *H01L 21/2658* (2013.01); *H01L 21/845* (2013.01); *H01L 29/1033* (2013.01); *H01L 29/1095* (2013.01); *H01L 29/16* (2013.01); *H01L 29/785* (2013.01); *H01L 29/7851* (2013.01); *H01L 21/266* (2013.01); *H01L 21/324* (2013.01)

(58) Field of Classification Search
CPC .... H01L 29/745; H01L 21/845; H01L 29/785
USPC ................................ 438/283; 257/288, 327
See application file for complete search history.

(56) References Cited

U.S. PATENT DOCUMENTS

| | | |
|---|---|---|
| 7,662,679 B2 | 2/2010 | Izumida et al. |
| 7,843,000 B2 | 11/2010 | Yu et al. |

(Continued)

FOREIGN PATENT DOCUMENTS

| | | |
|---|---|---|
| JP | 2010-192926 A | 9/2010 |
| JP | 2012-182354 A | 9/2012 |

(Continued)

OTHER PUBLICATIONS

Office Action issued Dec. 11, 2015, in related Korean Application No. 10-2015-0073867 (English translation provided).

(Continued)

*Primary Examiner* — David Vu
*Assistant Examiner* — Brandon Fox
(74) *Attorney, Agent, or Firm* — McDermott Will & Emery LLP (57) ABSTRACT

A method for manufacturing a semiconductor device includes forming a fin structure having a top surface and side surfaces. A mask layer is disposed over the top surface. A doping support layer is formed to cover part of the fin structure. A first impurity is introduced into a first region of the fin structure covered by the doping support layer, by implanting the first impurity into the doping support layer so that the implanted first impurity is introduced into the first region of the fin structure through the side surfaces.

19 Claims, 4 Drawing Sheets

(51) Int. Cl.
*H01L 29/78* (2006.01)
*H01L 21/84* (2006.01)
*H01L 21/265* (2006.01)
*H01L 21/266* (2006.01)
*H01L 21/324* (2006.01)

(56) References Cited

U.S. PATENT DOCUMENTS

| | | | |
|---|---|---|---|
| 8,722,431 B2 | 5/2014 | Pradhan et al. | |
| 9,087,860 B1* | 7/2015 | Banghart | H01L 29/66803 |
| 2012/0224438 A1 | 9/2012 | Inaba | |
| 2013/0280883 A1* | 10/2013 | Faul | H01L 21/2255 |
| | | | 438/434 |
| 2014/0159126 A1* | 6/2014 | Wei | H01L 29/66795 |
| | | | 257/288 |
| 2014/0239354 A1 | 8/2014 | Huang et al. | |
| 2015/0044829 A1* | 2/2015 | Kim | H01L 21/823807 |
| | | | 438/199 |
| 2015/0144877 A1* | 5/2015 | Mears | H01L 21/324 |
| | | | 257/20 |
| 2015/0179503 A1* | 6/2015 | Tsai | H01L 21/76224 |
| | | | 257/347 |
| 2015/0303284 A1* | 10/2015 | Basker | H01L 29/66803 |
| | | | 257/288 |

FOREIGN PATENT DOCUMENTS

| KR | 10-2014-0107075 A | 9/2014 |
|---|---|---|
| TW | 201044466 A | 12/2010 |
| TW | 201318073 A | 5/2013 |

OTHER PUBLICATIONS

Office Action Taiwanese Patent Application No. 104131730 dated Jan. 6, 2017.
Office Action Korean Patent Application No. 10-2015-0073867 dated Aug. 17, 2016 with full English Translation.
Notice of Allowance Korean Patent Application No. 10-2015-0073867 dated Apr. 25, 2017 with English translation.

* cited by examiner

SEMICONDUCTOR DEVICE INCLUDING FIN STRUCTURES AND MANUFACTURING METHOD THEREOF

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. In Fin FET devices, the upper portion of the fin structure functions as a channel, while the lower portion of the fin structure functions as a well.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
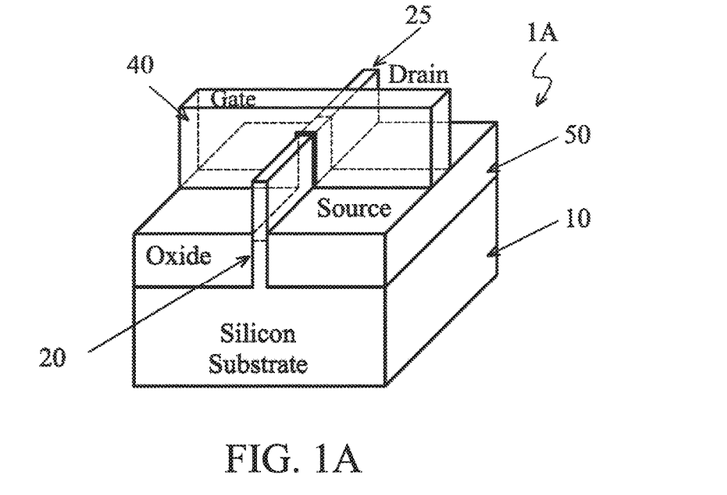
FIG. 1A is an exemplary perspective view of a semiconductor FET device having a fin structure (Fin FET) according to one embodiment of the present disclosure.
Figure 1B:
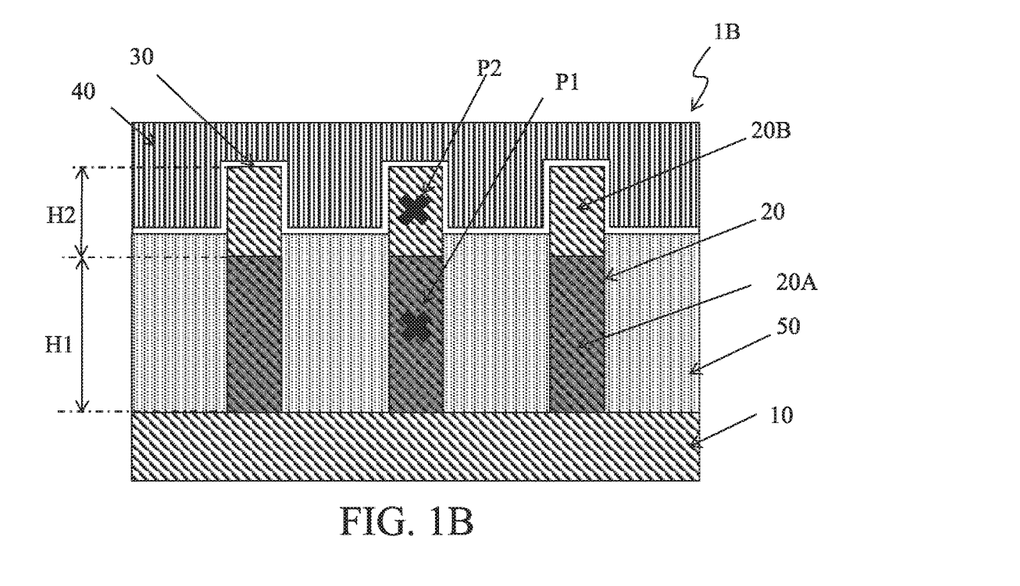
FIG. 1B is an exemplary cross sectional view of the semiconductor device having a fin structure along a gate electrode according to one embodiment of the present disclosure.

FIG. 1A is an exemplary perspective view of a semiconductor FET device having a fin structure (Fin FET) according to one embodiment of the present disclosure, and FIG. 1B is an exemplary cross sectional view of the semiconductor device having a fin structure along a gate electrode according to one embodiment of the present disclosure. In these figures, some layers/features are omitted for simplification.

The Fin FET devices 1A, 1B include, among other features, a substrate 10, a fin structure 20, a gate dielectric 30 and a gate electrode 40. In this embodiment, the substrate 10 is a silicon substrate. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structure 20 is disposed over the substrate. The fin structure 20 may be made of the same material as the substrate 10 and may continuously extend from the substrate 10. In this embodiment, the fin structure is made of Si. The silicon layer of the tin structure 20 may be intrinsic, or appropriately doped with an n-type impurity or a p-type impurity.

In FIG. 1A, one fin structure 20 is disposed over the substrate 10, while in FIG. 1B, three fin structures 20 are disposed over the substrate 10. However, the number of the fin structures is not limited to three. The numbers may be one, two or four or more. In addition, one of more dummy fin structures may be disposed adjacent both sides of the fin structures 20 to improve pattern fidelity in patterning processes. The width of the fin structure 20 is in a range of about 5 nm to about 40 nm in some embodiments, and may be in a range of about 7 nm to about 12 nm in certain embodiments. The height of the fin structure 20 is in a range of about 100 nm to about 300 nm in some embodiments, and may be in a range of about 50 nm to 100 nm in other embodiments.

The lower part of the fin structure 20 under the gate electrode 40 is referred to as a well layer 20A having a height H1, and the upper part of the fin structure 20 is referred to as a channel layer 20B having a height H2, as shown in FIG. 1B. Under the gate electrode 40, the well layer 20A is embedded in the isolation insulating layer 50, and the channel layer 20B protrudes from the isolation insulating layer 50. A lower part of the channel layer 20B may also be embedded in the isolation insulating layer 50 to a depth of about 1 nm to about 5 nm.

The height H1 of the well layer 20A is in a range of about 60 nm to 100 nm in some embodiments, and the height H2 of the channel layer 20B is in a range of about 40 nm to 60 nm. In certain embodiments, the height H2 is in a range of about 38 nm to about 55 nm.

Further, spaces between the fin structures 20 and/or a space between one fin structure and another element formed over the substrate 10 are filled by an isolation insulating layer 50 (or so-called a "shallow-trench-isolation (STI)" layer) including an insulating material. The insulating material for the isolation insulating layer 50 may include silicon oxide, silicon nitride, silicon oxynitride (SiON), SiOCN, fluoride-doped silicate glass (FSG), or a low-K dielectric material.

The channel layer 20B protruding from the isolation insulating layer 50 is covered by a gate dielectric layer 30, and the gate dielectric layer 30 is further covered by a gate electrode 40. Part of the channel layer 20B not covered by the gate electrode 40 functions as a source and/or drain of the MOS FET (see, FIG. 1A).

In certain embodiments, the gate dielectric layer 30 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 40 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, one or more work function adjustment layers (not shown) may be interposed between the gate dielectric layer 30 and the gate electrode 40. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer may include a first metal material for the n-channel Fin FET and a second metal material for the p-channel Fin FET. For example, the first metal material for the n-channel Fin FET may include metals having a work function substantially aligned with a work function of the substrate conduction band, or at least substantially aligned with a work function of the conduction band of the channel layer 20B. Similarly, for example, the second metal material for the p-channel Fin FET may include metals having a work function substantially aligned with a work function of the substrate valence band, or at least substantially aligned with a work function of the valence band of the channel layer 20B. In some embodiments, the work function adjustment layer may alternately include a polysilicon layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions 25 are also formed in the channel layer 20B not covered by the gate electrode 40, by appropriately doping impurities in the source and drain regions 25. An alloy of Si or Ge and a metal such as Co, Ni, W, Ti or Ta may be formed on the source and drain regions 25.

Further, the gate electrode 40 and the source/drain regions 25 are covered by an interlayer insulating film (not shown), and necessary wirings and/or via/contact holes are disposed so as to complete the semiconductor device.

In the fin structure 20, an impurity concentration of the channel layer 20B is smaller than that of the well layer 20A. In the well layer 20A, impurities have been doped from outside the fin structure, thereby increasing the impurity concentration in the well layer. On the other hand, the impurity concentration of the channel layer 20B is substantially the same as an impurity concentration of the substrate 10.

In certain embodiments, the impurity concentration of the channel layer 20B at the center point P2 of the channel layer 20B is equal to or less than $1 \times 10^{16}$ $cm^{-3}$. In some embodiments, the channel layer 20B is a channel layer of an n-type FET containing a p-type impurities of which the concentration is in a range of about $1.12 \times 10^{15}$ $cm^{-3}$ and about $1.68 \times 10^{15}$ $cm^{-3}$. In some embodiments, the channel layer 20B is a channel layer for a p-type FET containing a n-type impurities of which the concentration is in a range of about $0.905 \times 10^{15}$ $cm^{-3}$ and about $2.34 \times 10^{15}$ $cm^{-3}$.

In certain embodiment, the impurity concentration of the well layer 20A at the center point P1 of the well layer 20A is equal to or more than about $1 \times 10^{18}$ $cm^{-3}$. In some embodiments, the impurity concentration of the well layer 20A is in a range about $1 \times 10^{18}$ $cm^{-3}$ to about $2 \times 10^{19}$ $cm^{-3}$.

Since the impurity concentration in the channel layer 20B is minimized, it is possible to suppress carrier mobility in the channel layer 20B from degrading caused by impurity scattering. For example, when the Fin FET device 1A, 1B is made of silicon and the impurity is boron of which the concentration is about $1 \times 10^{16}$ $cm^{-3}$ or less, electron mobility in the channel layer may be about 1200 $cm^2$/V·sec or more, and when the Fin FET device 1A, 1B is made of silicon and the impurity is phosphorous of which the concentration is about $1 \times 10^{16}$ $cm^{-3}$ or less, hole mobility in the channel layer may be about 400 $cm^2$/V·sec or more.

FIGS. 2-12 show cross sectional views of exemplary sequential processes of manufacturing the Fin FET device according to one embodiment of the present disclosure. It is understood that additional operations can be provided before, during, and after processes shown by FIGS. 2-12, and some of the operations described below can be replaced or eliminated, for additional embodiments of the method. The order of the operations/processes may be interchangeable.

Figure 2:
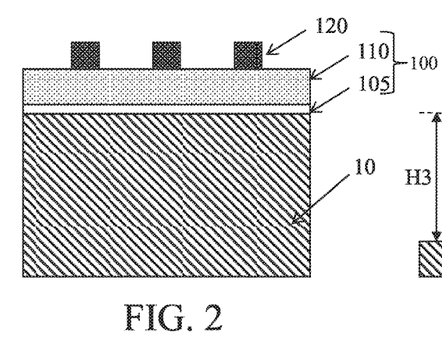
FIGS. 2-12 show exemplary processes for manufacturing the Fin FET device according to one embodiment of the present disclosure.

As shown in FIG. 2, a mask layer 100 is formed over the substrate 10 by, for example, a thermal oxidation process and/or a chemical vapor deposition (CVD) process. The substrate 10 is, for example, a p-type silicon substrate with an impurity concentration being in a range of about $1.12 \times 10^{15}$ cm$^{-3}$ and about $1.68 \times 10^{15}$ cm$^{-3}$. In other embodiments, The substrate 10 is an n-type silicon substrate with an impurity concentration being in a range of about $0.905 \times 10^{15}$ cm$^{-3}$ and about $2.34 \times 10^{15}$ cm$^{-3}$. The mask layer 100 includes, for example, a pad oxide (e.g., silicon oxide) layer 105 and a silicon nitride mask layer 110 in some embodiments.

The pad oxide layer 105 may be formed by using thermal oxidation or a CVD process. The silicon nitride mask layer 110 may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 105 is in a range of about 2 nm to about 15 nm and the thickness of the silicon nitride mask layer 110 is in a range of about 2 nm to about 50 nm in some embodiments. A mask pattern 120 is further formed over the mask layer 100. The mask pattern 120 is, for example, a photo resist pattern formed by photo lithography.

By using the mask pattern 120 as an etching mask, a hard mask pattern of the pad oxide layer 105 and the silicon nitride mask layer 100 is formed. The width of the hard mask pattern is in a range of about 5 nm to about 40 nm in some embodiments. In certain embodiments, the width of the hard mask patterns is in a range of about 7 nm to about 12 nm.

Figure 3:
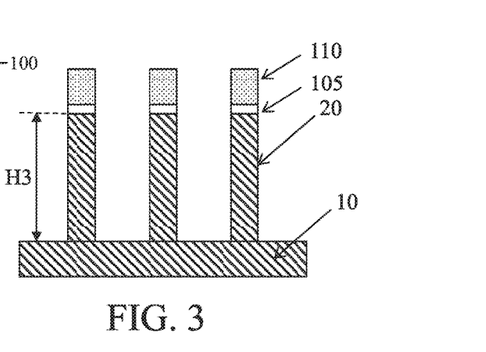

As shown in FIG. 3, by using the hard mask pattern as an etching mask, the substrate 10 is patterned into fin structures 20 by trench etching using a dry etching method and/or a wet etching method. A height H3 of the fin structure 20 is in a range of about 100 nm to about 300 nm. In certain embodiments, the height H3 is in a range of about 50 nm to about 100 nm. When the heights of the fin structures are not uniform, the height H3 from the substrate may be measured from the plane that corresponds to the average heights of the fin structures.

In this embodiment, a bulk silicon wafer is used as a starting material and constitutes the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

Figure 4:
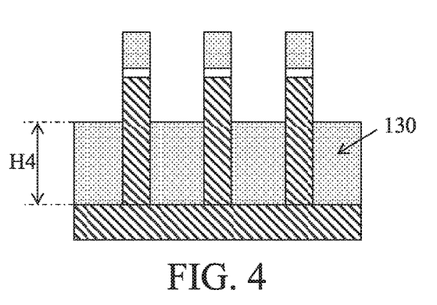

As shown in FIG. 4, a doping support layer 130 is formed over the substrate 10 so as to partially cover lower part of the fin structure 20.

The doping support layer 130 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total. The doping support layer 130 may be formed by using SOG. SiO, SiON, SiOCN or fluoride-doped silicate glass (FSG) may be used as the doping support layer 130 in some embodiments. After forming the doping support layer 130, a thermal process, for example, an anneal process, may be performed to improve the quality of the doping support layer 130.

In certain embodiment, the height H4 of the doping support layer 130 is about 1 nm to about 3 nm higher than the desired height H1 of the well layer 20A, or the upper surface of the doping support layer 130 is about 1 nm to about 3 nm lower than the bottom of the desired channel layer 20B.

Figure 5:
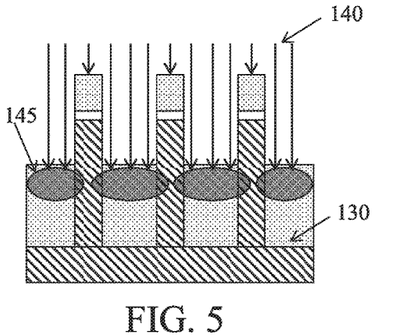

As shown in FIG. 5, first impurity ions 140 are implanted into the doping support layer 130. An acceleration voltage for the first impurity ions 140 is in a range about 0.5 keV to about 2.0 keV, and a dose amount is in a range of about $1 \times 10^{13}$ to about $1 \times 10^{14}$ cm$^{-2}$, in some embodiments. In this operation, since the top surface of the fin structure 20 is covered by the hard mask including the pad oxide layer 105 and the silicon nitride mask layer 110, the first impurity ions may not be implanted into the channel layer 20B of the fin structure 20 through the top surface. In other words, the thickness of the mask layer, in particular, the thickness of the nitride layer 110, is adjusted to prevent ions from being implanted to the channel layer 20B through the top surface. The first impurity ions may be P$^+$ for an n-type well or BF$_2^+$ or B$^+$ for a p-type well.

When the first impurity ions are implanted into the doping support layer 130, the first impurity ions are scattered by the constituent elements of the doping support layer 130, and some of the first impurity ions penetrate into the fin structure as illustrated by region 145 of FIG. 5. Eventually, the implanted first impurities may function as a punch-through stopper in the FET.

Figure 6:
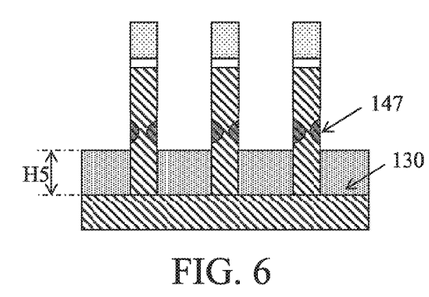

Then, as shown in FIG. 6, the thickness of the doping support layer 130 is reduced by, for example, an etch-back process so that the height of the doping support layer 130 becomes H5. The etch back process may be performed by remote plasma etching using NF$_3$ and NH$_3$ gas. By adjusting etching time, a desired thickness of the doping support layer 130 can be obtained. The remaining thickness H5 is adjusted to a range of about 10 nm to about 150 nm in some embodiments. By reducing the thickness of the doping support layer 130, the region 147 of the fin structure 20, into which the first impurity ions have been introduced, may be exposed from the doping support layer 130.

Figure 7:
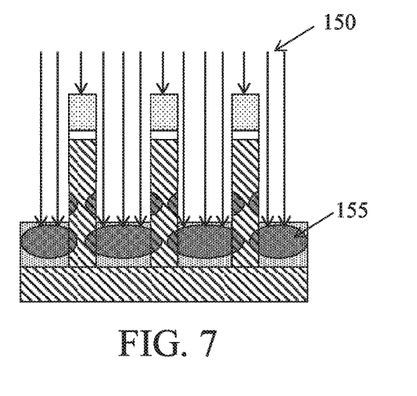

As shown in FIG. 7, second impurity ions 150 are implanted into the doping support layer 130 with the reduced thickness. An acceleration voltage for the second impurity ions 150 is in a range about 2.0 keV to about 5.0 keV, and a dose amount is in a range of about $1 \times 10^{13}$ to about $1 \times 10^{14}$ cm$^{-2}$, in some embodiments. In this operation, since the upper surface of the fin structure 20 is covered by the hard mask including the pad oxide layer 105 and the silicon nitride mask layer 110, the second impurity ions may not be implanted into the channel layer 20B of the fin structure 20. The first impurity ions may be $P^+$ for an n-type well or $BF_2^+$ or boron for a p-type well.

When the second impurity ions are implanted into the doping support layer 130 with the reduced thickness, the second impurity ions are scattered by the constituent elements of the doping support layer 130, and some of the second impurity ions penetrate into the fin structure as, illustrated by region 155 of FIG. 7. Eventually, the implanted second impurities may function as well doping in the FET.

In the embodiment above, since the upper surface of the fin structure 20 is covered by the hard mask including the pad oxide layer 105 and the silicon nitride mask layer 110, the first and second impurity ions are not implanted into the channel layer 20B of the fin structure 20 from the top surface of the fin structure 20. In other words, the thickness of the mask layer, in particular, the thickness of the nitride layer 110, is adjusted to prevent ions from being implanted to the channel layer 20B through the top surface. Therefore, the impurity concentration in the channel layer 20B remains at the back ground level, i.e., substantially the same as the impurity concentration of the substrate 10.

Figure 8:
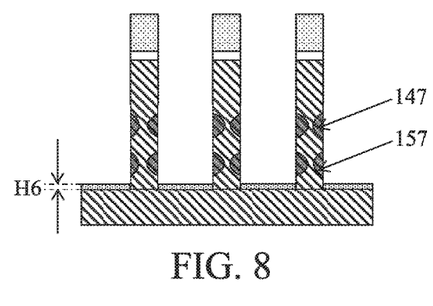

Then, as shown in FIG. 8, the thickness of the doping support layer 130 is further reduced by, for example, an etch-back process so that the height of the doping support layer 130 becomes H6. By adjusting etching time, a desired thickness of the doping support layer 130 can be obtained. The remaining thickness H6 is adjusted to a range of about 1 nm to about 10 nm in some embodiments. In some embodiments, the doping support layer may be completely removed. By further reducing the thickness of the doping support layer 130 (or by removing the doping support layer 130), the region 157 of the fin structure 20, into which the second impurity ions have been introduced, may be exposed from the doping support layer 130.

Figure 9:
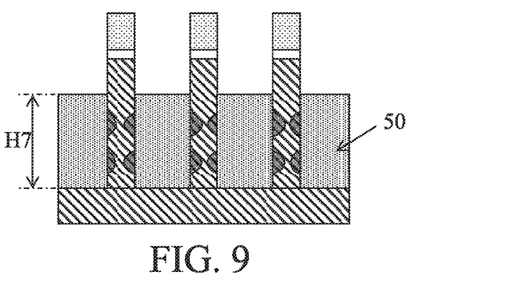

As shown in FIG. 9, an isolation insulating layer 50 is formed over the substrate 10 so as to partially cover lower part of the fin structure 20. The height H7 (thickness) of the isolation insulating layer 50 as deposited may be substantially the same as the height H1 (the well layer height) or slightly greater than H1.

The isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total. The isolation insulating layer 50 may be formed by SOG. SiO, SiON, SiOCN or fluoride-doped silicate glass (FSG) may be used as the isolation insulating layer in some embodiments.

Figure 10:
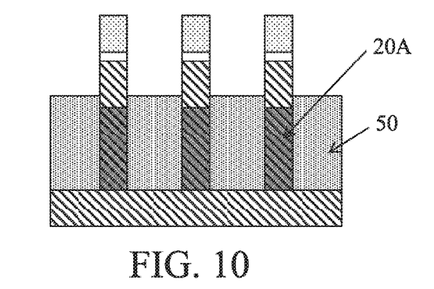

As shown in FIG. 10, after forming the isolation insulating layer 50, a thermal process, for example, an anneal process, is performed so that the implanted first and second impurities diffuse in the fin structure 20 so as to form the well layer 20A. The thermal process may also improve the quality of the isolation insulating layer 50.

In certain embodiments, the thermal process is performed by using rapid thermal annealing (RTA) at a temperature in a range of about 900° C. to about 1050° C. for about 1.5 second to about 10 second in inert gas ambient, for example, $N_2$, Ar or He ambient.

In one embodiment, the thickness H4 of the doping support layer 130 is set about 1 nm to about 3 nm higher than the desired height H1 of the well layer 20A, or the upper surface of the doping support layer 130 is set about 1 nm to about 3 nm lower than the bottom of the desired channel layer 20B (see, FIG. 4). Accordingly, the region 147 of the fin structure 20, into which the first impurity ions are introduced, is located about 3 nm to about 5 nm below the channel layer 20B. With this configuration, undesirable diffusion of the impurities into the channel layer 20B from the implanted region 147 of the well layer 20A during the thermal process can be minimized.

Figure 11:
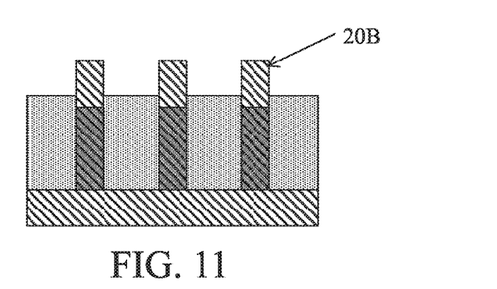

As shown in FIG. 11, the mask layer including the pad oxide layer 105 and the silicon nitride mask layer 100 are removed by using dry etching, planarization methods including a chemical mechanical polish (CMP) and/or wet etching. In this operation, the isolation insulating layer 50 may slightly be etched. In such a case, the height H7 of the isolation insulating layer 50 as deposited may be adjusted such that the etched isolation insulating layer 50 substantially has the well layer height H1.

Figure 12:
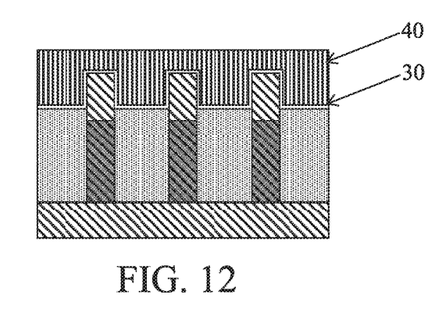

As shown in FIG. 12, the gate structure including a gate dielectric layer 30 and a gate electrode 40 is formed over the fin structure 20 with the exposed channel layers 20B, thereby forming the Fin FET device 1B.

The gate dielectric layer 30 is formed by CVD, PVD, ALD, e-beam evaporation, or other suitable process. When the gate dielectric layer 30 is silicon oxide, $SiH_4$, $Si_2H_6$ and/or $Si_2Cl_6$ is used as a source gas. When the gate dielectric layer 30 is silicon nitride, $SiH_4$, $Si_2H_6$ and/or $Si_2Cl_6$ and $NH_3$ are used as source gases. When the gate dielectric layer 30 is hafnium oxide, zirconium oxide, aluminum oxide or titanium oxide, metal hydride, metal chloride and/or organic metal including Hf, Zr, Al or Ti is used as a source gas.

The gate electrode 40 may be formed by a film forming process by using ALD, PVD, CVD, e-beam evaporation, electroplating or other suitable process, and a patterning process. Metal hydride, metal chloride and/or organic metal including Ti, Ta, Co, Si, Zr, Al or W is used as a source gas. The gate structure may be formed using a gate-last or replacement gate methodology.

Figure 13:
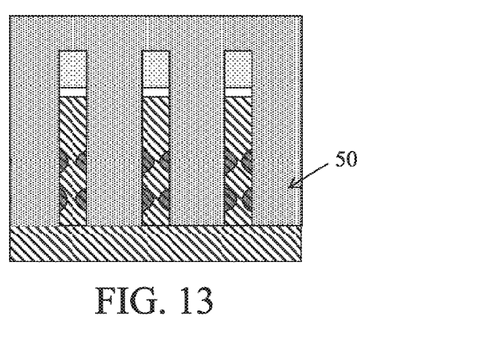
FIG. 13 shows an exemplary process for manufacturing the Fin FET device according to another embodiment of the present disclosure.
Figure 14:
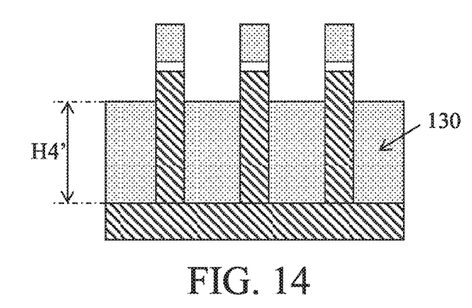
FIGS. 14-17 show exemplary processes for manufacturing the Fin FET device according to yet another embodiment of the present disclosure.

In another embodiment of the present disclosure, instead of forming the isolation insulating layer 50 as shown in FIG. 9, the isolation insulating layer 50 may be formed so that the entire fin structures 20 are embedded in the isolation insulating layer 50, as shown in FIG. 13. After forming the isolation insulating layer 50, a planarization operation is performed so as to remove part of the isolation insulating layer 50 and the mask layer including the pad oxide layer 105 and the silicon nitride mask layer 100. Then, the isolation insulating layer 50 is further removed so that the channel layer 20B is exposed, as shown in FIG. 11. The annealing process as explained with respect to FIG. 10 may be performed between the processes of FIG. 13 to FIG. 11. The height of the isolation insulating layer 50 in FIG. 11 is adjusted to be substantially the same as the height H1.

In the above embodiments, the first and second impurity ions are implanted into the doping support layer 130. However, it may be possible to implant third (and fourth or more) impurity ions into the doping support layer by adjusting the thickness of the doping support layer 130. In other words, the operations of reducing the thickness of the doping support layer 130 (similar to FIG. 6) and implanting impurity ions into the doping support layer 130 (similar to FIG. 7) may be repeated twice or more.

For example, in a certain embodiment, the third impurity ions may be implanted into the doping support layer 130 with a thickness between H4 and 115, between the operations of FIGS. 5 and 6, or into the doping support layer 130 with a thickness of less than H5 after the operation of FIG. 7. By repeating the operations of reducing the thickness of the doping support layer 130 (similar to FIG. 6) and implanting impurity ions into the doping support layer 130 (similar to FIG. 7), it will be possible to more precisely control impurity profile and/or uniformity in the fin structure 20.

Further, in the operation of implanting the first (and/or second) impurity ions, different types of ions may be introduced in separate ion implantation operations (e.g., two or more ion implantation operations), while maintaining the thickness of the doping support layer 130.

FIGS. 14-17 show cross sectional views of other exemplary sequential processes of the Fin FET device according to one embodiment of the present disclosure. It is understood that additional operations can be provided before, during, and after processes shown by FIGS. 14-17, and some of the operation described below can be replaced or eliminated, for additional embodiments of the method. The order of the operations/processes may be interchangeable.

Similar to FIG. 4 above, a doping support layer 130 is formed over the substrate 10 so as to partially cover lower part of the tin structure 20. However, in this embodiment shown in FIG. 14, the height H4' of the doping support layer 130 may be the same as or greater than the height H4 as shown in FIG. 4.

Figure 15:
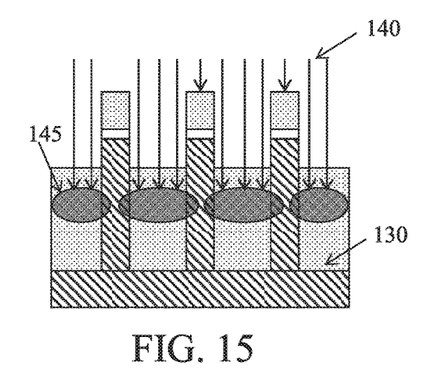

Similar to FIG. 5, first impurity ions 140 are implanted into the doping support layer 130, as shown in FIG. 15. In this operation, when the thickness H4' is greater than the thickness H4, the acceleration voltage of the first impurity ions 140 may be greater than the case of FIG. 5, so that the first impurities are introduced into substantially the same regions 147 in the fin structure 20. In this operation, since the upper surface of the fin structure 20 is covered by the hard mask including the pad oxide layer 105 and the silicon nitride mask layer 110, the first impurity ions may not be implanted into the channel layer 20B of the fin structure 20.

Figure 16:
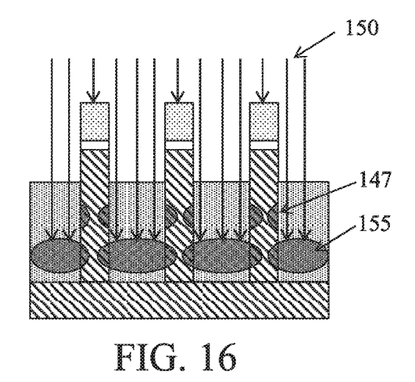

Then, as shown in FIG. 16, second impurity ions 150 are implanted into the doping support layer 130. In this operation, the acceleration voltage of the second impurity ions 150 is greater as than that of the first impurity ions 140, so that the second impurities are introduced into a deeper region in the doping support layer 150, as shown in FIG. 16. An acceleration voltage for the second impurity ions 150 is in a range about 5.0 keV to about 10.0 keV, and a dose amount is in a range of about $1 \times 10^{13}$ to about $1 \times 10^{14}$ cm$^{-2}$, in some embodiments. In this operation, since the upper surface of the fin structure 20 is covered by the hard mask including the pad oxide layer 105 and the silicon nitride mask layer 110, the first impurity ions may not be implanted into the channel layer 20B of the fin structure 20.

Figure 17:
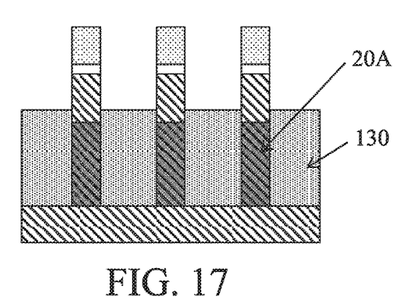

Subsequently, a thermal process, for example, an anneal process, is performed to diffuse the implanted first and second impurities in the fin structure 20, as shown in FIG. 17. In this embodiment, the doping support layer 130 may function as the isolation insulating layer 50.

By changing acceleration voltages, third (and fourth or more) impurity ions may be introduced in different regions (depths) of the doping support layer 130. By implanting impurity ions in different depths, it will be possible to more precisely control impurity profile and/or uniformity in the fin structure 20.

In the embodiment above, since the upper surface of the fin structure 20 is covered by the hard mask including the pad oxide layer 105 and the silicon nitride mask layer 110, the first and second impurity ions are not implanted into the channel layer 20B of the fin structure 20 from the top surface of the fin structure 20. In other words, the thickness of the mask layer, in particular, the thickness of the nitride layer 110, is adjusted to prevent ions from being implanted to the channel layer 20B through the top surface. Therefore, the impurity concentration in the channel layer 20B remains at the background level, i.e., substantially the same as the impurity concentration of the substrate 10.

The various embodiments or examples described herein offer several advantages over the existing art. For example, in the present disclosure, since the impurity ions are not implanted through the top surface of the fin structure, it is possible to minimize the impurity concentration in the channel layer of the fin structure, thereby suppressing degradation of carrier mobility in the channel layer. Further, since the impurities are introduced into different regions of the well layer of the fin structure by two or more operations, uniformity of the impurities in the well layer can be improved. Moreover, since the thickness H4 of the doping support layer may be set about 1 nm to about 3 nm higher than the desired height H1 of the well layer, or the upper surface of the doping support layer may be set about 1 nm to about 3 nm lower than the bottom of the desired channel layer, undesirable diffusion of the impurities into the channel layer from the well layer during the annealing operation can be suppressed.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a fin structure having a top surface and side surfaces, with a mask layer being disposed over the top surface and forming a doping support layer to cover part of the fin structure. A first impurity is introduced into a first region of the fin structure covered by the doping support layer. The first impurity is introduced into the doping support layer so that the implanted first impurity is introduced into the first region of the fin structure through the side surfaces.

In accordance with another aspect of the present disclosure, a method for manufacturing a semiconductor device includes forming a fin structure having a top surface and side surfaces, with a mask layer being disposed over the top surface, and forming a doping support layer so as to cover part of the fin structure. A first impurity is introduced into a first region of the fin structure covered by the doping support layer, by implanting the first impurity accelerated at a first acceleration voltage into the doping support layer so that the implanted first impurity is introduced into the first region of the fin structure through the side surfaces. A second impurity is introduced into a second region of the fin structure covered by the doping support layer, by implanting the second impurity accelerated at a second acceleration voltage into the doping support layer so that the implanted second impurity is introduced into the second region of the fin structure through the side surfaces.

In accordance with another aspect of the present disclosure, a semiconductor device includes a fin structure protruding from a substrate, and a gate structure disposed over the fin structure. The fin structure includes, under the gate structure, a well layer and a channel layer disposed over the well layer. An impurity concentration of the channel layer is equal to or less than $1 \times 10^{16}$ cm$^{-3}$, and an impurity concentration of the well layer is equal to or more than $1 \times 10^{18}$ cm$^{-3}$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a fin structure having a top surface and side surfaces, a mask layer being disposed over the top surface;
    forming a doping support layer to cover part of the fin structure;
    introducing a first impurity into a first region of the fin structure covered by the doping support layer, by implanting the first impurity into the doping support layer so that the implanted first impurity is introduced into the first region of the fin structure through the side surfaces;
    after introducing the first impurity, reducing a thickness of the doping support layer; and
    introducing a second impurity into a second region of the fin structure covered by the doping support layer, whose thickness has been reduced, by implanting the second impurity into the doping support layer, whose thickness has been reduced so that the implanted second impurity is introduced into the second region of the fin structure through the side surfaces.

2. The method of claim 1, wherein the first impurity is not introduced into the fin structure through the top surface.

3. The method of claim 1, wherein the forming a fin structure comprises:
    forming an oxide layer over a substrate;
    forming a nitride layer over the oxide layer;
    forming a mask pattern over the nitride layer;
    patterning the oxide layer and the nitride layer by using the mask pattern as a mask to form the mask layer; and
    patterning the substrate by using the mask layer as a mask to obtain the fin structure.

4. The method of claim 3, wherein the doping support layer includes silicon oxide.

5. The method of claim 4, wherein the silicon oxide of the doping support layer is formed by a CVD process.

6. The method of claim 3, further comprising:
    annealing the fin structure after the first and second impurities have been introduced to obtain a well layer in the fin structure.

7. The method of claim 6, wherein
    a thickness of the doping support layer formed in the forming a doping support layer is 1 to 3 nm greater than a thickness of the well layer.

8. The method of claim 6, wherein the annealing the fin structure comprises:
    forming an insulating layer over the substrate to cover the first and second regions of the fin structure; and
    annealing the fin structure covered with the insulating layer.

9. The method of claim 3, further comprising, after introducing the second impurity:
    further reducing the thickness of the doping support layer; and
    introducing a third impurity into a third region of the fin structure covered by the doping support layer, whose thickness has been further reduced, by implanting the third impurity into the doping support layer, whose thickness has been further reduced so that the implanted third impurity is introduced into the third region of the fin structure through the side surfaces.

10. A method for manufacturing a semiconductor device, comprising:
    forming a fin structure having a top surface and side surfaces, a mask layer being disposed over the top surface;
    forming a doping support layer to cover part of the fin structure;
    introducing a first impurity into a first region of the fin structure covered by the doping support layer, by implanting the first impurity accelerated at a first acceleration voltage into the doping support layer so that the implanted first impurity is introduced into the first region of the fin structure through the side surfaces; and
    introducing a second impurity into a second region of the fin structure covered by the doping support layer, by implanting the second impurity accelerated at a second acceleration voltage into the doping support layer so that the implanted second impurity is introduced into the second region of the fin structure through the side surfaces.

11. The method of claim 10, wherein the forming a fin structure comprises:
    forming an oxide layer over a substrate;
    forming a nitride layer over the oxide layer;
    forming a mask pattern over the nitride layer;
    patterning the oxide layer and the nitride layer by using the mask pattern as a mask to form the mask layer; and
    patterning the substrate by using the mask layer as a mask to obtain the fin structure.

12. The method of claim 10, wherein the doping support layer includes silicon oxide formed by a CVD process.

13. The method of claim 10, further comprising:
    annealing the fin structure after the first and second impurities have been introduced.

14. The method of claim 13, wherein the annealing the fin structure comprises:
    forming an insulating layer over the substrate to cover the first and second regions of the fin structure, and
    annealing the fin structure covered with the insulating layer.

15. The method of claim 10, further comprising:
introducing a third impurity into a third region of the fin structure covered by the doping support layer, by implanting the third impurity accelerated at a third acceleration voltage into the doping support layer so that the implanted third impurity is introduced into the third region of the fin structure through the side surfaces.

16. The method of claim 10, wherein the first impurity is not introduced into the fin structure through the top surface.

17. A semiconductor device, comprising:
a fin structure protruding from a substrate; and
a gate structure disposed over the fin structure, wherein:
the fin structure includes, under the gate structure, a well layer and a channel layer disposed over the well layer,
a length of the well layer along a normal direction perpendicular to a surface of the substrate is greater than a vertical length of the channel layer along the normal direction,
an impurity concentration of the channel layer is equal to or less than $1 \times 10^{16}$ cm$^{-3}$, and
an impurity concentration of the well layer is equal to or more than $1 \times 10^{18}$ cm$^{-3}$.

18. The semiconductor device of claim 17, wherein:
the fin structure is made of silicon, and
electron mobility in the channel layer is 1200 cm$^2$/V·sec or more.

19. The semiconductor device of claim 17, wherein:
the fin structure is made of silicon, and
hole mobility in the channel layer is 400 cm$^2$/V·sec or more.

* * * * *